(12) United States Patent
Cox et al.

(10) Patent No.: US 7,126,671 B2
(45) Date of Patent: Oct. 24, 2006

(54) LITHOGRAPHIC APPARATUS AND DEVICE MANUFACTURING METHOD

(75) Inventors: Henrikus Herman Marie Cox, Eindhoven (NL); Dominicus Jacobus Petrus Adrianus Franken, Veldhoven (NL); Nicolaas Rudolf Kemper, Eindhoven (NL); Engelbertus Antonius Fransiscus Van Der Pasch, Oirschot (NL); Martijn Johannes Verbunt, Eindhoven (NL); Lambertus Adrianus Van Den Wildenberg, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 101 days.

(21) Appl. No.: 10/806,344

(22) Filed: Mar. 23, 2004

(65) Prior Publication Data

US 2004/0227107 A1 Nov. 18, 2004

(30) Foreign Application Priority Data

Apr. 4, 2003 (EP) .................................. 03252145

(51) Int. Cl.
*G03B 27/34* (2006.01)
*G03B 27/42* (2006.01)
*G03B 27/52* (2006.01)

(52) U.S. Cl. .......................................... 355/57; 355/53
(58) Field of Classification Search ................. 355/57, 355/55, 53, 60, 66; 456/450; 359/843, 846
See application file for complete search history.

(56) References Cited

U.S. PATENT DOCUMENTS

| | | | |
|---|---|---|---|
| 5,153,419 A | 10/1992 | Takahashi | |
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,549,270 B1 * | 4/2003 | Ota | 355/55 |

FOREIGN PATENT DOCUMENTS

| | | |
|---|---|---|
| EP | 1 041 607 A1 | 10/2000 |
| EP | 1 065 532 A2 | 1/2001 |
| EP | 1 065 568 A2 | 1/2001 |
| EP | 1 089 327 A1 | 4/2001 |
| EP | 1 107 068 A2 | 6/2001 |
| EP | 1 209 503 A2 | 5/2002 |
| EP | 1 107 068 A3 | 12/2003 |
| JP | 2000-286189 | 10/2000 |
| JP | 2004-246060 | 9/2004 |
| JP | 2004-266264 | 9/2004 |
| WO | 98/33096 | 7/1998 |
| WO | 98/38597 | 9/1998 |
| WO | 98/40791 | 9/1998 |
| WO | 03/014827 A1 | 2/2003 |

OTHER PUBLICATIONS

European Search Report in reference to EP 03 25 2145 dated Jan. 28, 2004.
European Search Report in reference to EP 04 25 1739 dated Jul. 8, 2004.
Japanese Official Action issued for Japanese Patent Application No. 2004-102926, dated Feb. 3, 2006.

* cited by examiner

*Primary Examiner*—Peter B. Kim
(74) *Attorney, Agent, or Firm*—Pillsbury Winthrop Shaw Pittman LLP

(57) ABSTRACT

In a projection system for EUV, the positions of mirrors are measured and controlled relative to each other, rather than to a reference frame. Relative position measurements may be made by interferometers or capacitive sensors mounted on rigid extensions of the mirrors.

12 Claims, 4 Drawing Sheets

LITHOGRAPHIC APPARATUS AND DEVICE MANUFACTURING METHOD

BACKGROUND OF THE INVENTION

1. Priority Information

This application claims priority from European Patent Application No. 03252145.2, filed Apr. 4, 2003, herein incorporated by reference in its entirety.

2. Field of the Invention

The present invention relates to a lithographic apparatus and a device manufacturing method.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

- a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and

- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In order to image smaller features, lithographic projection apparatus employing extreme ultraviolet (EUV) radiation, e.g. with a wavelength in the region of 5–20 nm, are being developed. Such apparatus generally employ reflective optical systems as the illumination and projection systems because of the difficulty in making a refractive optical element functioning at EUV wavelengths. Accordingly, it is necessary to maintain the positions and orientations of the reflectors in the projection system with extremely high accuracy.

SUMMARY OF THE INVENTION

There are, however, problems associated with using reflective optics in the projection system, such as, the position and shape of the projected image are very sensitive to errors in the position and orientation of the reflectors in the projection system. In particular, an error in the orientation of a mirror gives rise to an error in image position at substrate level of the order of the angular error multiplied by the length of the beam path between mirror and substrate. Since the length of the beam path may be of the order of meters, even an angular error of the order of nrads can give rise to a position error or distortion of the order of nm. Additionally, rigidly mounting the reflectors to a frame does not give the required accuracy as the rigidity, mechanical stability and thermal stability requirements that must be met by the frame are impracticable. It has therefore been proposed to actively mount the reflectors so that their positions relative to a reference frame can be continuously monitored and corrected. This approach is feasible but still imposes very stringent rigidity and stability requirements on the reference frame.

For these and other reasons, the principles of the present invention, as embodied and broadly described herein, provide for a projection system in which the optical elements can be maintained in their correct positions with very high accuracy. In one embodiment, the transfer apparatus comprises a radiation system configured to provide a beam of radiation, a support structure configured to support a patterning device that imparts the beam of radiation with a desired pattern, a substrate holder configured to hold a substrate, a projection system configured to project the patterned beam of radiation onto a target portion of the substrate, and a positioning system configured to maintain at least a first optical element and a second optical element in predetermined positions, the at least first and second optical elements corresponding to at least one of the radiation system and the illumination system. The positioning system comprises at least one position sensor that directly measures a relative position of at least the first optical element relative to the second optical element, wherein the positioning system maintains the first and second optical elements in a predetermined relative position.

By directly measuring the relative positions of optical elements in the projection system and using an actuated, or so-called active, mounting system to maintain the optical elements in predetermined relative positions and/or orientations, the need for a large, rigid and highly stable reference frame is eliminated. A small reference frame may still be provided to form a reference to maintain the position and orientation of the projection system as a whole, but this may be omitted if the positions of the patterning means and substrate table are measured and controlled directly relative to the projection system.

In an embodiment of the invention, the positioning system comprises at least one interferometric displacement measuring device for measuring the relative position(s) and/or orientation(s) of said first and second optical elements. An interferometric displacement measuring device can readily provide a sufficiently accurate measurement of relative movements of two objects at the spacing of the optical elements in the projection system and the interferometer beams can be arranged as desired without interfering with the projection beam. For convenience, rigid extensions to the optical elements may be provided to carry beam directing elements for the interferometer beams.

In another embodiment, at least one of the first and second optical elements has a rigid extension reaching close to the other of said first and second optical elements, or an extension thereof, and said positioning system comprises capacitive sensors mounted on said rigid extension(s) and/or said optical element(s) for measuring the relative positions of said first and second optical elements. Capacitive sensors are relatively simple, compact and reliable and are particularly suitable for measuring the small displacements expected of the optical elements in the projection system.

Of course, a combination of interferometric displacement measuring devices, linear or multi-dimensional encoders, and/or capacitive or other types of sensors may be used as convenient in a particular embodiment of the invention.

While the invention may be used in projection systems of many types, it is particularly advantageous when applied in a projection system employing reflectors, such as multilayer mirrors, for which the positioning requirements are particularly strict, with permitted errors of the order of nm or less.

The projection system may employ a variety of different control systems, for example a position feedback loop having a bandwidth appropriate to the expected disturbances on the projection system.

According to another embodiment of the present invention there is provided a device manufacturing method comprising providing a substrate, providing a beam of radiation using a radiation system, imparting a desired pattern onto said beam of radiation by a patterning device, projecting said patterned beam of radiation onto a target portion of said substrate via a projection system, wherein at least one of said radiation system and said projection system comprises at least a first element and a second optical element which are maintained in predetermined positions by, directly measuring the relative positions of said first and second optical elements, and controlling the positions of said first and second optical elements based on the direct measurement of their relative positions.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
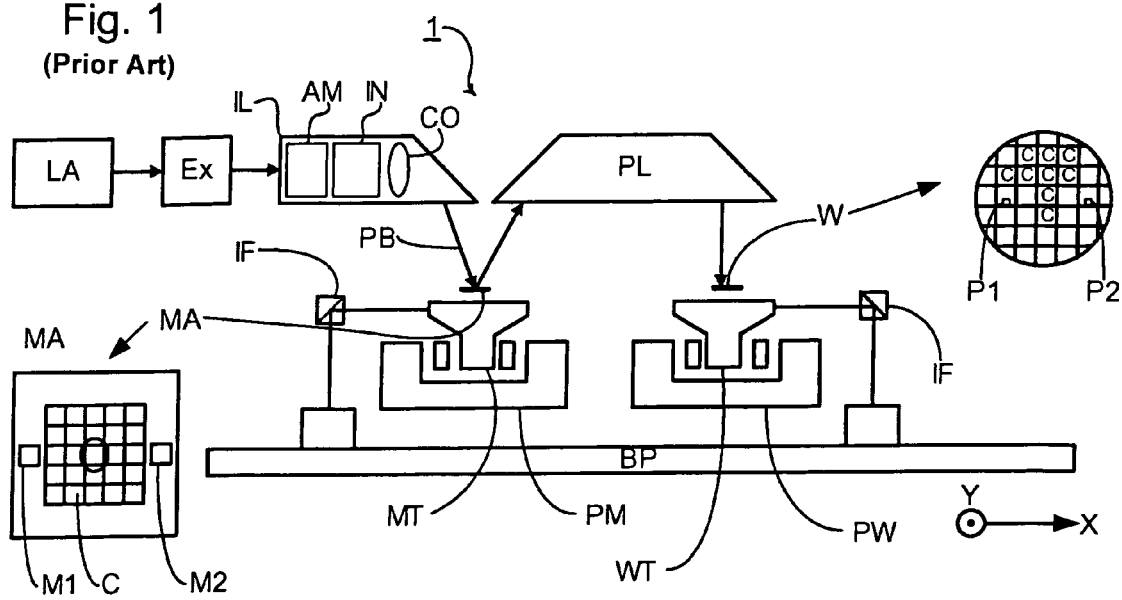
FIG. 1 depicts a lithographic projection apparatus according to an embodiment of the invention.

FIG. 1 schematically depicts a lithographic apparatus according to a particular embodiment of the invention. The apparatus comprises:

- a radiation system Ex, IL: for supplying a projection beam PB of radiation (e.g. UV radiation). In this particular case, the radiation system also comprises a radiation source LA;
- a first object table (mask table) MT: provided with a mask holder for holding a mask MA (e.g. a reticle), and connected to first positioning mechanism PM for accurately positioning the mask with respect to item PL;
- a second object table (substrate table) WT: provided with a substrate holder for holding a substrate W (e.g. a resist-coated silicon wafer), and connected to second positioning mechanism PW for accurately positioning the substrate with respect to item PL; and
- a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in a variety of different modes:

- step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure;
- scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion; and
- other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

EMBODIMENTS

The projection system PL consists of a mirror group, e.g. made up of 6 mirrors which have multilayer coatings forming distributed Bragg reflectors to provide optimum reflectivity at the wavelength of the projection beam, which might be 13.5 or 11.4 nm. Further details of suitable systems may be found in European Patent Application EP1209503-A, while further details of suitable multilayer reflectors may be found in European Patent Applications EP-1065532-A and EP-1065568-A, which documents are hereby incorporated by reference.

Figure 2:
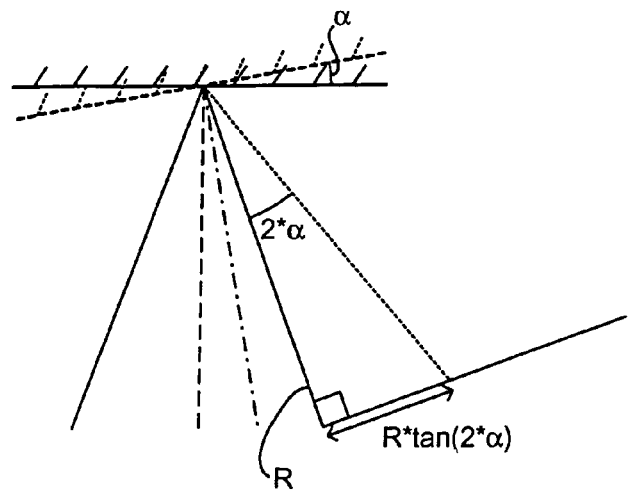
FIG. 2 is a diagram illustrating the effect on image position at substrate level of a change in orientation of a reflector in the projection system.

A problem with projection systems that employ reflectors is that the image position and distortion are very sensitive to mirror positioning errors, particularly angular errors. For example, as shown in that FIG. 2, a mirror rotation of $\alpha$, between the ideal position, shown in solid, and a rotated position, shown in phantom, results in an error in the angle of the reflected beam of $2\alpha$ and a positioning error at substrate level of $R^* \tan (2\alpha)$, where R is the total path length between the mirror and the substrate. Accordingly, it is necessary to maintain the reflectors of the projection system at their correct positions and orientations to very high degrees of accuracy, e.g. within nm and nrad over a time period of several minutes.

Rather than statically mount the reflectors to a rigid frame, the reflectors are actively mounted using actuators that can position them with a sufficiently high accuracy, for example piezo-electric actuators, Lorenz actuators, electromagnetic, pneumatic or other motors. Knowledge of the positions of the reflectors is necessary to control the active mounts. A system of measurement devices to provide this is shown in FIG. 3.

Figure 3:
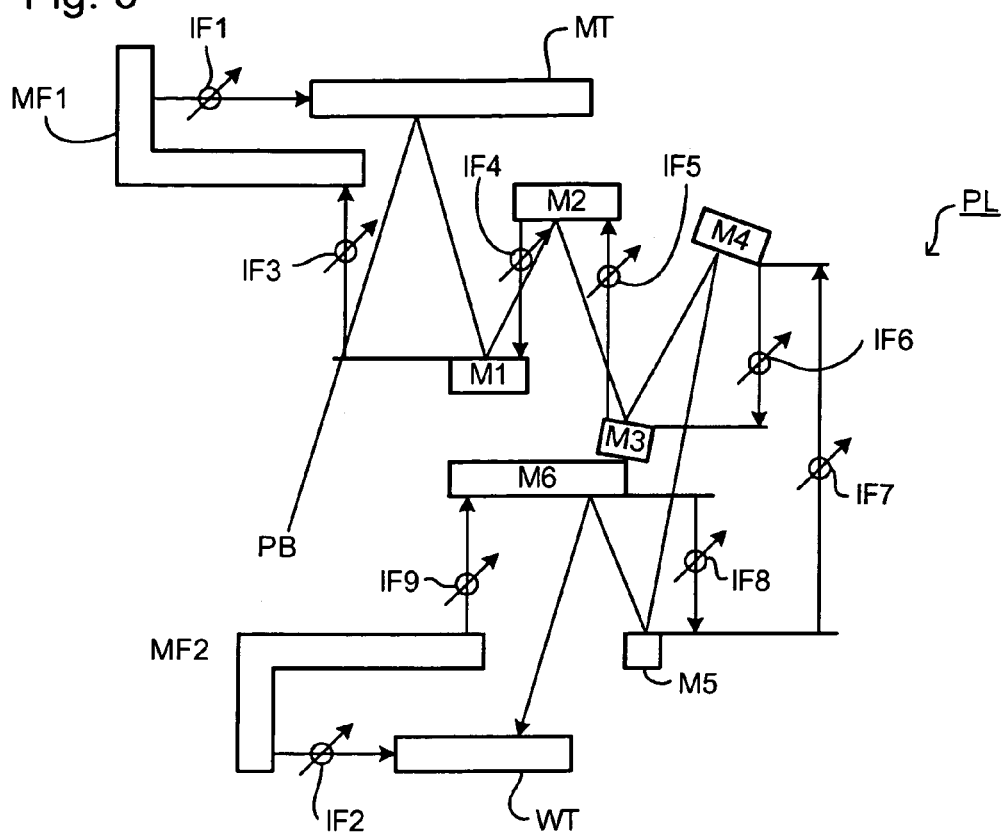
FIG. 3 depicts the layout of the projection system of the apparatus of FIG. 1 in greater detail.

FIG. 3 depicts the mask table/holder MT, the projection system PL and the substrate table/holder WT. The projection beam PB, supplied by the radiation system (not shown in this Figure) is directed onto the mask held on the mask table MT which selectively reflects it according to the desired pattern to be printed. The patterned projection beam PB is projected on to the substrate held on the substrate table WT by reflectors M1 to M6 which form the projection system PL. The positions of the mask table MT and substrate table WT are measured relative to respective reference frames MF1 and MF2 by interferometric measuring devices IF1 and IF2 respectively. These systems may be of known form and measure the positions of the mask table MT and substrate table WT to nanometer accuracy.

In accordance with the present invention, positions of the reflectors M1 to M6 are measured by additional interferometric measuring devices IF3 to IF9. Of these, IF3 measures the position of reflector M1 relative to the first reference frame MF1. IF4 measures the position of reflector M2 relative to M1, IF5 measures M3 relative to M2 and so on until IF8 which measures the position of reflector M6 relative to M5. Finally, interferometric measuring device IF9 measures the position of reflector M6 relative to reference frame MF2.

Figure 4:
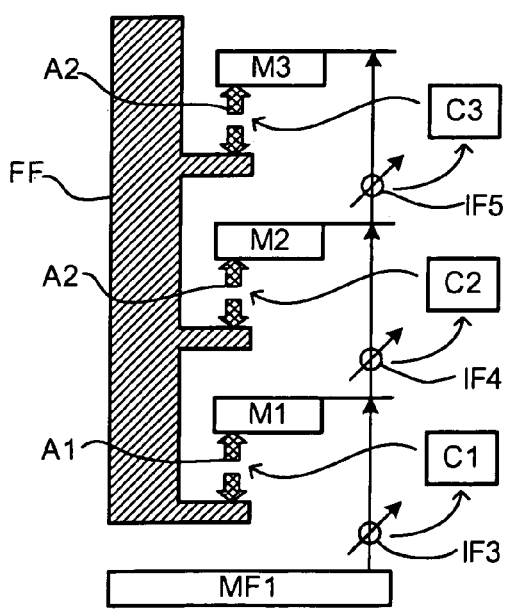
FIG. 4 depicts the basic configuration of the positioning system for the optical elements in the projection system of FIG. 3.

FIG. 4 schematically depicts the positioning systems for reflectors M1 to M3, the positioning systems of the other reflectors correspond. Each of the reflectors is positioned by an actuator system A1, A2, A3 . . . which acts against a force frame FF and controls the position of the respective reflector in the necessary number of degrees of freedom. Normally, control in six degrees of freedom is provided, but in the event that the projected image is insensitive to errors in one or more degrees of freedom of a given reflector, that reflector may be passively mounted in that degree of freedom.

Respective control circuits C1, C2, C3, . . . control the actuator systems in response to the position information provided by the interferometric displacement measuring mechanisms to maintain the reflectors in the desired positions. Reflector M1 is positioned relative to the mask stage reference frame MF1 while reflector M2 is positioned relative to M1, M3 is positioned relative to M2 and so on. Thus, the reflectors are all maintained in the correct relative positions and the system as a whole is maintained in the correct position relative to reference frame MF1.

While FIG. 4 shows mirror M1 as being controlled by the first control C1, this need not be the case. In fact, it may be preferable that the first controller, responsive to an interferometer measuring to the reference frame, controls the mirror having the strictest positioning requirements or the mirror for which the largest excursions from the nominal position are expected. The order of mirrors in the control scheme need not be the same as the order of mirrors in the optical layout and may instead follow an order of control priority.

It will be appreciated that the relative positions of the reflectors may be calibrated on machine set-up and periodically thereafter and may also be varied during use of the apparatus, e.g. to compensate for errors elsewhere or to adjust imaging parameters, e.g. magnification.

The various control systems may be simple feedback loops of appropriate bandwidth, tracking externally determined setpoints or may be more complex and incorporate feed-forward elements and take account of other inputs than measured position, e.g. velocity or acceleration. A given control system may have inputs from other interferometers or even other control systems, e.g. to provided feed-forward control to compensate for internal disturbances such as reaction forces from actuators attached to other mirrors.

It will be appreciated that while the actuators systems are shown acting between the various reflectors and a common force frame FF, multiple force frames may be used and the force frame(s) do not have the same rigidity and stability requirements as a reference frame, since it plays no part in the measurement of the positions of the mirrors.

Figure 5:
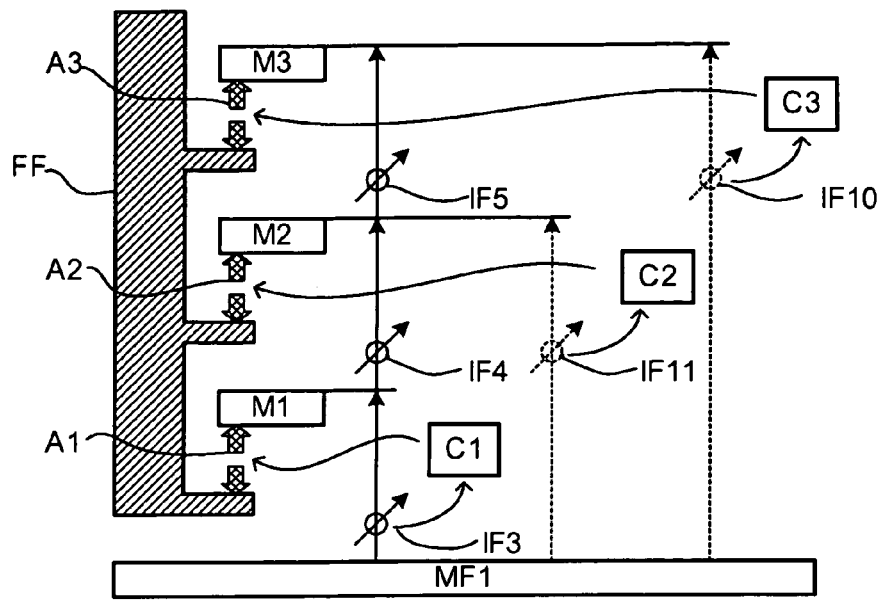
FIG. 5 depicts a variant of the positioning system of FIG. 4.

A variant positioning system is shown in FIG. 5. In this positioning system, the various reflectors are control to maintain set positions relative to the reference frame MF1. For reflector M1, there is no change, but for reflector M2, the control system C2 is responsive to "virtual" measuring system IF11, which is formed as the sum of the measurements of measuring systems IF3 and IF4. In the meantime, control system C3 is responsive to virtual measuring system IF10, which is formed as sum of the measurements of measuring systems IF3, IF4 and IF5, and so on. This arrangement is advantageous in that mirror errors are not additive.

In FIG. 4, the position accuracy of optical element M3 also contains the filtered residual position errors from elements M1 and M2. If the reference frame MF1 is moving, the sensor IF3 will measure this (reference is moving). The control loop C1 will try to track the motions of MF1. The result will be an almost equivalent motion of M1 that is filtered by the characteristics of the control loop C1. Part of the motion of MF1 will not be tracked (especially motions that have a high frequency). The C1 position loop will have a residual position error.

Now sensor IF4 detects a motion of its reference (=M1). C2 will try to track this motion which is now much easier because the high frequency part of the original motion of MF1 is filtered out (by the control loop C1). Again the C2 position loop will have a residual position error that is much smaller than the error of the C1-loop. Finally sensor IF5 detects a motion of its reference (=M2). C3 tracks this motion and the residual position error of C3 is very small. The actual physical position of M3 relative to MF1 however may be much different than required.

If all elements have the same servo bandwidth, then M1 will have the most accurate physical positioning accuracy relative to MF1, but the control error will be large. M2 will have a worse physical positioning accuracy relative to MF1 but the but the control error will be modest. M3 will have a large physical positioning accuracy relative to MF1 but the but the control error will be very small. The overall system performance of such a "stacked system" is not just the sum of all position elements, but depends on the bandwidth of all position loops and their filtering via the sensor references. The position control is done in co-ordinates that represent relative position of the optical elements to the MF (for C1) or relative to another optical element (for C2 and C3).

The system of FIG. 5 can have a much smaller additive filtering error. All positions are controlled in co-ordinates that represent the relative position of the optical elements to a single reference MF1 (for C1, C2 and C3). The sensors IF3, IF4 and IF5 measure the relative position of respectively M1, M2 and M3 to the reference position MF1. The "virtual sensor" IF11 is formed by the sum of IF3+IF4, IF10 is formed by the sum of IF3+IF4+IF5. Sensor IF11 will see the unfiltered position of M1 relative to MF1 and the unfiltered position of M2 relative to M1. Sensor IF10 will see the unfiltered positions of M1 to MF1, M2 to M1 and M3 to M2. So controlling in these co-ordinates results in a better actual physical positioning accuracy.

It should be noted that as well as the serial and parallel arrangements of FIGS. 4 and 5, hybrid arrangements such as tree structures may also be used. For example, control loop C1 may control based on IF3 measuring M1 relative to MF1 while C2 and C3 both control based on real or virtual interferometers measuring their respective mirrors relative to M1.

Figure 6:
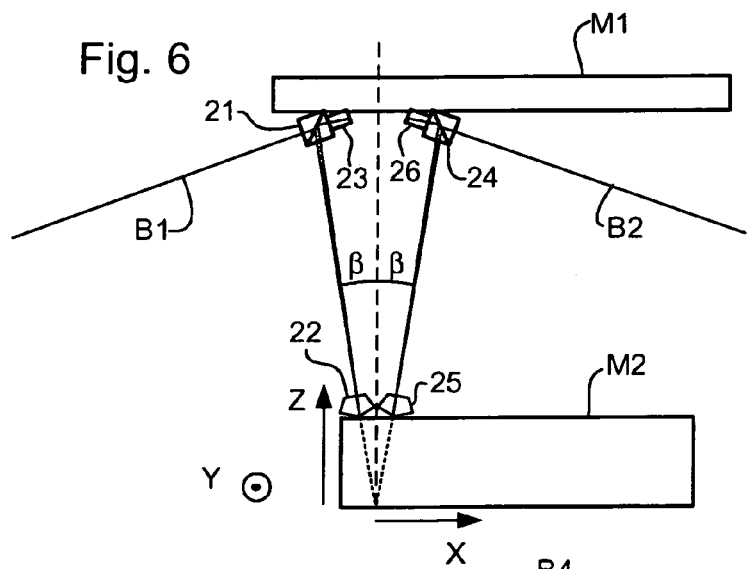
FIG. 6 depicts an arrangement of two interferometers with near vertical beams to measure horizontal and vertical displacements.
Figure 7:
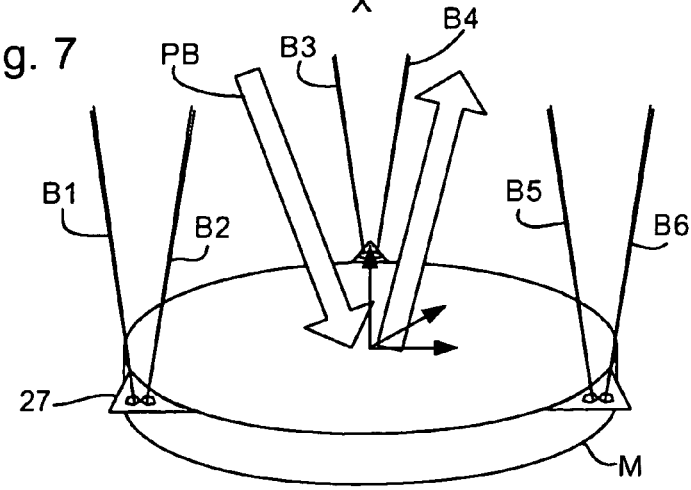
FIG. 7 depicts an arrangement of three pairs of interferometer to measure displacements of a mirror in six degrees of freedom.

FIGS. 6 and 7 illustrate how interferometer beams at a small angle of inclination to one axis of a coordinate system can be used to measure displacements in six degrees of freedom. As shown in FIG. 6, two polarizing beam splitters 21, 24 and two detectors 23, 26 are mounted on the mirror M1 to be followed, the "reference" mirror. The two beam splitters 21, 24 are inclined at equal but opposite angles +β and −β0 to a Z axis generally perpendicular to the optical surface of the mirror M2 to be controlled so that one polarization state of each of two laser beams B1, B2 directed to the beams splitters from conveniently located sources is directed towards reflector M2.

The two beams are reflected by corner cubes 22, 25 located on the backside of the reflector M2 which return the beams along parallel paths without angular insensitivity. At the beam splitters on the reference reflector, the beams sent to the controlled reflector and back are recombined with the other polarization state and the resulting interference signals are detected by the detectors 23,26. The interference signals IFM1 and IFM2 are given by:

$$IFM1 = \Delta X^* \sin(\beta) + \Delta Z^* \cos(\beta) \tag{1}$$

$$IFM2 = -\Delta X^* \sin(\beta) + \Delta Z^* \cos(\beta) \tag{2}$$

where $\Delta X$ and $\Delta Z$ are the relative displacements of the controlled and followed reflectors in the X and Z directions. $\Delta X$ and $\Delta Z$ can therefore be derived as follows:

$$\Delta X = (IFM1 - IFM2)/(2^* \sin \beta) \tag{3}$$

$$\Delta Z = (IFM1 + IFM2)/(2^* \cos \beta) \tag{4}$$

With three pairs of beams distributed around the reflectors, and the beams in one of the pairs inclined towards the Y direction rather than the X direction, as shown in FIG. 7, displacements in X, Y, Z, Rx, Ry and Rz can be measured.

In another embodiment of the present invention, optical rulers (encoders) or capacitive or other sensors mounted on extensions to the mirrors are employed instead of interferometric displacement measuring devices.

Figure 8:
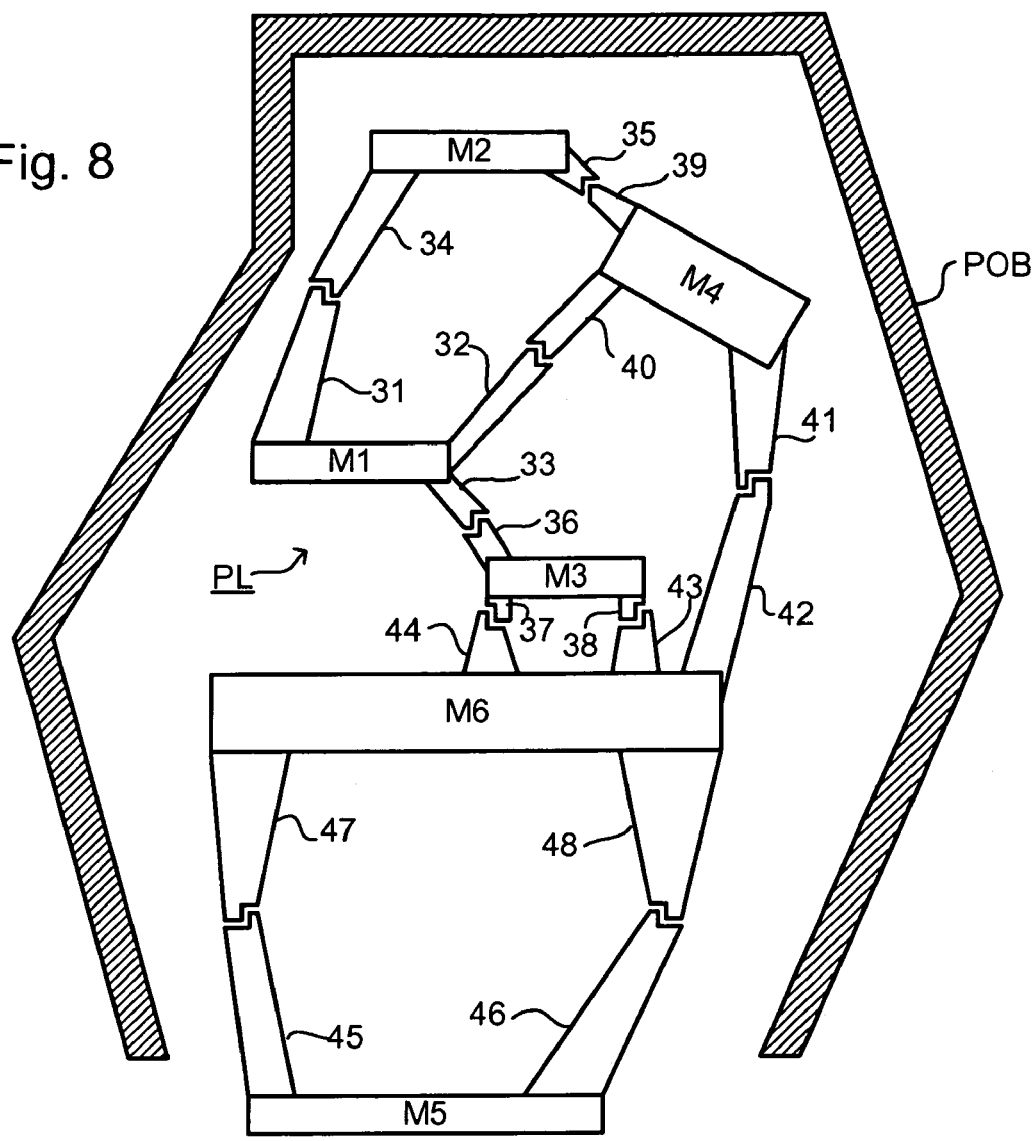
FIG. 8 depicts the projection system of a second embodiment of the invention.
Figure 9:
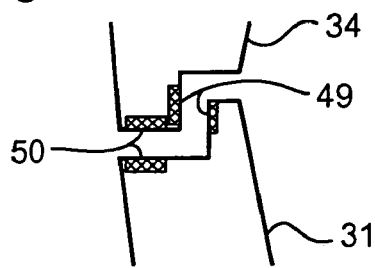
FIG. 9 is an enlarged view of an arrangement of capacitive sensors on the ends of rigid extensions in the projection system of FIG. 8.

FIG. 8 illustrates the projection system PL which comprise reflectors M1 to M6 contained within projection optics box POB. Each of reflectors M1 to M6 consists of the reflector itself mounted in a frame construction, made out of a material having a low coefficient of thermal expansion, e.g. Zerodur™. The frames each also include one or more extensions 31 to 48 that project towards neighboring reflectors. Where two projections almost meet, proximity sensors 49, 50 (see FIG. 9) are provided.

The sensors may be relatively simple capacitive sensors with a measuring accuracy of 10–50 pm (picometer) and a range of 1–5 μm. Although in FIG. 9 two sensors are shown at the meeting of two extensions 31, 34, there may be from 1 to 6 sensors at each meeting point. With a system of six mirrors moveable in 6 degrees of freedom each, 30 measurements are required to characterize the relative positions of the mirrors so there should be a minimum of 30 sensors. However, additional redundant sensors may be provided for increased accuracy. Also, three or more extensions may meet at a single location. The extensions are arranged as convenient, to avoid infringing upon the path of the projection beam while keeping the extensions as short as possible. The extensions, even in total, are much smaller and less complex than a reference frame against which positions of all of the reflectors can be measured.

A combination of long range sensors, e.g. interferometers, as used in the first embodiment and short range sensors mounted on rigid extensions to the optical elements as used in the second embodiment may also be used.

While specific embodiments of the invention have been described above, it will be appreciated that the invention may be practiced otherwise than as described. For example, the invention may also be applied to reflective or refractive elements in a catadioptric optical system or to refractive elements in a wholly refractive optical system. Also, the elements controlled may be part of the radiation system, e.g. in a source-collector module or an illuminator module.

Thus, the description is not intended to limit the invention and the configuration, operation, and behavior of the present invention has been described with the understanding that modifications and variations of the embodiments are possible, given the level of detail present herein. Accordingly, the preceding detailed description is not meant or intended to, in any way, limit the invention—rather the scope of the invention is defined by the appended claims.

What is claimed is:

1. A lithographic apparatus, comprising:
a radiation system configured to provide a beam of radiation;
a support structure configured to support a patterning device that imparts said beam of radiation with a desired pattern;
a substrate holder configured to hold a substrate;
a projection system configured to project said patterned beam of radiation onto a target portion of said substrate; and
a positioning system configured to maintain at least a first optical element and a second optical element in predetermined positions, said at least first and second optical elements being disposed in said radiation system and/or said projection system, said positioning system comprising:
at least one position sensor that directly measures a relative position of at least said first optical element relative to said second optical element, and
at least one interferometric displacement measuring device for measuring at least the relative position and orientation of said first and second optical elements,
wherein the at least one of the first and second optical elements includes a rigid extension carrying a beam directing element for an interferometer beam of the interferometric displacement measuring device.

2. The apparatus according to claim 1, wherein at least one of the first and second optical elements contains a rigid extension reaching close to the other of said first and second optical elements, or an extension thereof, and said positioning system comprises at least one of an optical ruler, capacitive ruler, and analog capacitive sensor mounted on at least one of said rigid extension and said first and second optical elements in order to measure the relative positions of said first and second optical elements.

3. The apparatus according to claim 1, further comprising a reference frame and wherein said positioning system comprises a measuring device for measuring the position of said first optical element relative to said reference frame.

4. The apparatus according to claim 3, wherein said positioning system comprises first and second actuators configured to respectively displace said first and second optical elements and first and second controllers configured to respectively control said first and second actuators, said first controller being responsive to the measured position of said first optical element relative to said reference frame and said second controller being responsive to the measured relative position of said first and second optical elements.

5. The apparatus according to claim 3, wherein said positioning system comprises first and second actuators configured to respectively displace said first and second optical elements and first and second controllers configured to respectively control said first and second actuators, said first controller being responsive to the measured position of said first optical element relative to said reference frame and said second controller being responsive to a sum of the measured position of said first optical element relative to said reference frame and the measured relative position of said first and second optical elements.

6. The apparatus according to claim 3, further comprising an additional displacement measuring device that measures the position of at least one of said support structure and said substrate holder relative to said reference frame.

7. The apparatus according to claim 1, wherein said first and second optical elements comprise reflectors.

8. A device manufacturing method, comprising:
providing a substrate;
providing a beam of radiation using a radiation system;
imparting a desired pattern onto said beam of radiation;
projecting said patterned beam of radiation onto a target portion of said substrate via a projection system;
maintaining a first optical element and a second optical element in predetermined positions by:
directly measuring the relative positions of said first and second optical elements,
employing an interferometer beam to measure at least the relative position and orientation of said first and second optical elements wherein the first and second optical elements include a rigid extension carrying a beam directing element for the interferometer beam, and
controlling the positions of said first and second optical elements based on the direct measurement of their relative positions.

9. A lithographic positioning system, comprising:
at least a first optical element and a second optical element situated in predetermined positions;
at least one position sensor that directly measures a relative position of at least said first optical element relative to said second optical element;
at least one interferometric displacement measuring device for measuring at least the relative position and orientation of said first and second optical elements, the at least one of the first and second optical elements including a rigid extension carrying a beam directing element for an interferometer beam of the interferometric displacement measuring device;
a first actuator and a second actuator;
a first controller and a second controller configured to respectively control said first and second actuators, said first controller being responsive to the measured relative position of said first optical element and said second controller being responsive to the measured relative position of said first and second optical elements;
wherein said first and second actuators operate to maintain said first and second optical elements in a predetermined relative position.

10. The system according to claim 9, wherein at least one of the first and second optical elements contains a rigid extension reaching close to the other of said first and second optical elements, or an extension thereof.

11. The system according to claim 10, further comprising at least one of an optical ruler, capacitive ruler, and analog capacitive sensor mounted on at least one of said rigid extension and said first and second optical elements in order to measure the relative positions of said first and second optical elements.

12. The system according to claim 9, wherein said first and second optical elements comprise reflectors.

* * * * *